US012702002B2

(12) United States Patent
Kim et al.

(10) Patent No.: US 12,702,002 B2
(45) Date of Patent: Aug. 4, 2026

(54) DOUBLE-SIDED HEAT DISSIPATION POWER SEMICONDUCTOR MODULE AND METHOD OF MANUFACTURING THE SAME

(71) Applicant: LX Semicon Co., Ltd., Daejeon (KR)

(72) Inventors: Deog Soo Kim, Daejeon (KR); Tae Ryong Kim, Daejeon (KR)

(73) Assignee: LX SEMICON CO., LTD, Daejeon (KR)

( * ) Notice: Subject to any disclaimer, the term of this patent is extended or adjusted under 35 U.S.C. 154(b) by 634 days.

(21) Appl. No.: 18/078,767

(22) Filed: Dec. 9, 2022

(65) Prior Publication Data

US 2023/0187309 A1      Jun. 15, 2023

(30) Foreign Application Priority Data

Dec. 15, 2021     (KR) ......................... 10-2021-0179919

(51) Int. Cl.
| | |
|---|---|
| *H10W 40/25* | (2026.01) |
| *H10W 74/01* | (2026.01) |
| *H10W 74/10* | (2026.01) |
| *H10W 90/00* | (2026.01) |
| *H10W 99/00* | (2026.01) |
| *H02P 27/06* | (2006.01) |
| *H10W 72/00* | (2026.01) |
| *H10W 72/20* | (2026.01) |

(52) U.S. Cl.
CPC ....... *H10W 40/255* (2026.01); *H10W 74/016* (2026.01); *H10W 74/114* (2026.01); *H10W 90/00* (2026.01); *H10W 99/00* (2026.01);

*H02P 27/06* (2013.01); *H10W 72/01235* (2026.01); *H10W 72/072* (2026.01); *H10W 72/223* (2026.01); *H10W 72/255* (2026.01); *H10W 90/724* (2026.01)

(58) Field of Classification Search
CPC ............ H01L 23/3735; H01L 21/4807; H01L 21/565; H01L 23/3121; H10W 40/255; H10W 74/016; H10W 74/114; H10W 90/00

See application file for complete search history.

(56) References Cited

U.S. PATENT DOCUMENTS

| | | | | | |
|---|---|---|---|---|---|
| 4,531,146 | A | * | 7/1985 | Cutchaw | ............... H10W 40/77 |
| | | | | | 361/689 |
| 4,546,410 | A | * | 10/1985 | Kaufman | ........... H05K 7/20454 |
| | | | | | 361/705 |
| 4,612,601 | A | * | 9/1986 | Watari | .................. H10W 72/00 |
| | | | | | 257/E23.09 |

(Continued)

FOREIGN PATENT DOCUMENTS

| | | | | | |
|---|---|---|---|---|---|
| CN | 110838480 | A | * | 2/2020 | ......... H10W 70/692 |
| CN | 109661723 | B | * | 3/2023 | ............ H10W 90/00 |

(Continued)

*Primary Examiner* — Laura M Menz
(74) *Attorney, Agent, or Firm* — Polsinelli PC

(57) ABSTRACT

The present disclosure relates to a technology relating to a power semiconductor module of which heat is dissipated through both sides thereof and provides a technology for maintaining a distance between an upper substrate and a lower substrate by a metal bump formed on one side of a power semiconductor die.

8 Claims, 9 Drawing Sheets

700

(56) References Cited

U.S. PATENT DOCUMENTS

| | | | | | |
|---|---|---|---|---|---|
| 4,914,551 | A | * | 4/1990 | Anschel | H10W 40/255 257/713 |
| 4,964,458 | A | * | 10/1990 | Flint | H10W 40/226 257/722 |
| 5,094,769 | A | * | 3/1992 | Anderson, Jr. | C09K 5/08 252/78.3 |
| 5,396,403 | A | * | 3/1995 | Patel | H10W 40/77 257/713 |
| 9,704,819 | B1 | * | 7/2017 | Gao | H10W 40/255 |
| 10,978,366 | B2 | * | 4/2021 | Fujino | H10W 70/468 |
| 11,251,106 | B2 | * | 2/2022 | Qin | H10W 40/255 |
| 2013/0270684 | A1 | * | 10/2013 | Negishi | H10W 70/461 174/257 |
| 2020/0075524 | A1 | * | 3/2020 | Seo | H10W 20/20 |
| 2020/0083129 | A1 | * | 3/2020 | Fujino | H10W 70/468 |
| 2021/0217681 | A1 | * | 7/2021 | Qin | H10W 40/255 |
| 2021/0358876 | A1 | * | 11/2021 | Tzu | H10W 40/255 |
| 2023/0187309 | A1 | * | 6/2023 | Kim | H10W 40/255 257/703 |
| 2023/0197557 | A1 | * | 6/2023 | Kim | H10W 40/255 257/678 |
| 2023/0197581 | A1 | * | 6/2023 | Kim | H10W 70/481 257/676 |
| 2024/0038733 | A1 | * | 2/2024 | Kim | H10W 40/255 |
| 2024/0096728 | A1 | * | 3/2024 | Seol | H10W 40/22 |

FOREIGN PATENT DOCUMENTS

| | | | | | |
|---|---|---|---|---|---|
| CN | 116344469 | A | * | 6/2023 | H10W 74/111 |
| CN | 117476571 | A | * | 1/2024 | H10W 74/114 |
| CN | 119092479 | A | * | 12/2024 | H10W 99/00 |
| CN | 119908033 | A | * | 4/2025 | H10W 90/00 |
| CN | 119965171 | A | * | 5/2025 | |
| DE | 112018000108 | T5 | * | 5/2019 | H10W 90/00 |
| DE | 112018000108 | B4 | * | 10/2020 | H10W 90/00 |
| DE | 102022133167 | A1 | * | 6/2023 | H10W 99/00 |
| DE | 102022133168 | A1 | * | 6/2023 | H10W 90/401 |
| EP | 4322210 | A1 | * | 2/2024 | H10W 74/114 |
| GB | 2246472 | A | * | 1/1992 | H10W 40/70 |
| JP | 2024019127 | A | * | 2/2024 | H10W 74/114 |
| KR | 2013013901 | A | | 12/2013 | |
| KR | 20200025159 | A | * | 3/2020 | H01L 24/06 |
| KR | 20210070928 | A | | 6/2021 | |
| KR | 20230092516 | A | * | 6/2023 | H10W 90/401 |
| KR | 20230095546 | A | * | 6/2023 | H10W 74/111 |
| KR | 20240017263 | A | * | 2/2024 | H10W 74/114 |
| KR | 20240040344 | A | * | 3/2024 | H10W 90/00 |
| WO | WO-2012086464 | A1 | * | 6/2012 | H10W 99/00 |
| WO | WO-2018155927 | A1 | * | 8/2018 | H10W 90/00 |

* cited by examiner

300

400

700

610

620    300a     300b     300c     300d     300e     300f

DOUBLE-SIDED HEAT DISSIPATION POWER SEMICONDUCTOR MODULE AND METHOD OF MANUFACTURING THE SAME

CROSS REFERENCE TO RELATED APPLICATION

This application claims priority to Republic of Korea Patent Application No. 10-2021-0179919 filed on Dec. 15, 2021, which is hereby incorporated by reference in its entirety.

BACKGROUND

1. Field of Technology

The present embodiment relates to a power semiconductor module and, more particularly, to a power semiconductor module the heat of which is dissipated to both sides thereof.

2. Related Technology

A semiconductor that is used in a device for processing high power, such as a converter or an inverter, is called a power semiconductor. The power semiconductor may be an insulated gate bipolar transistor (IGBT), a metal oxide semiconductor field effect transistor (MOSFET), or a diode, for example, and may have characteristics in that internal pressure is great and a high current may flow.

The power semiconductor may have a great switching loss and/or a great conduction loss due to high internal pressure and a high current. If a loss is great in the power semiconductor, the amount of heat dissipated is increased. The power semiconductor may have the great amount of heat dissipated due to the switching loss and/or the conduction loss.

If the amount of heat dissipated is not controlled to a proper level, the physical properties of a device may be changed, and the power semiconductor may not perform its own function. In order to prevent such problems, heat dissipation means may be added to the power semiconductor. A power semiconductor module may include at least power semiconductor within one package, and may have a proper heat dissipation form.

The power semiconductor module may be divided into a form in which the heat of the power semiconductor module is dissipated to one side thereof and a form in which the heat of the power semiconductor module is dissipated to both sides thereof.

The power semiconductor module of which the heat is dissipated to both sides thereof has been known to be advantageous in terms of heat dissipation because heat can be discharged in an upward direction and a downward direction from a power semiconductor die. However, such a double-sided heat dissipation power semiconductor module has been known to have a miss-alignment problem between components, a flatness problem attributable to a height deviation between components, a low yield problem attributable to an adhesion failure between an upper substrate and a lower substrate, a low reliability problem according to forms and materials of components, etc.

The discussions in this section are only to provide background information and do not constitute an admission of prior art.

SUMMARY

In such a background, the present embodiment is intended to provide a technology capable of solving the aforementioned problems of the double-sided heat dissipation power semiconductor module.

In an aspect, the present embodiment provides a power semiconductor module, including a die structure in which a metal bump having a certain thickness or more is formed on one side of a power semiconductor die, a first substrate electrically connected to a first electrode formed on the one side of the power semiconductor die through the metal bump, and a second substrate electrically connected to a second electrode formed on another side of the power semiconductor die and supporting the another side of the power semiconductor die.

In another aspect, the present embodiment provides a power semiconductor module, including a first die structure in which a first metal bump is formed on one side of a first power semiconductor die, a second die structure in which a second metal bump is formed on one side of a second power semiconductor die, a first substrate electrically connected to a first electrode formed on the one side of the first power semiconductor die through the first metal bump and electrically connected to a second electrode formed on another side of the second power semiconductor die, and a second substrate electrically connected to a second electrode formed on another side of the first power semiconductor die and electrically connected to a first electrode formed on the one side of the second power semiconductor die through the second metal bump.

In still another aspect, the present embodiment provides a method of manufacturing a power semiconductor, including forming a first metal bump on one side of a first power semiconductor die and forming a second metal bump on one side of a second power semiconductor die, bonding a first substrate to one side of the first metal bump and another side of the second power semiconductor die, bonding a second substrate to one side of the second metal bump and another side of the first power semiconductor die, and injecting an epoxy molding compound (EMC) into a space between the first substrate and the second substrate.

As described above, according to the present embodiment, a miss-alignment problem between components in the double-sided heat dissipation power semiconductor module can be improved. A flatness problem attributable to a height deviation between components can be improved. An adhesion failure problem between an upper substrate and a lower substrate can be improved. A low reliability problem according to forms and materials of components can be improved.

DETAILED DESCRIPTION OF EMBODIMENTS

Figure 1:
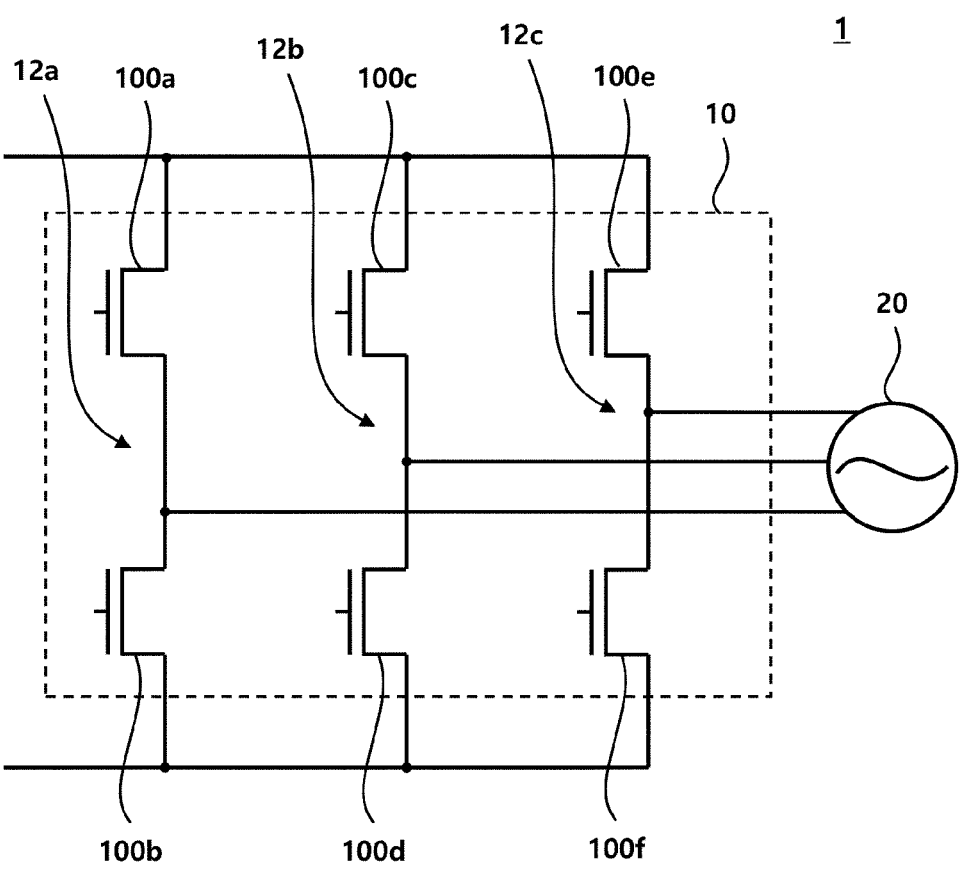
FIG. 1 is a construction diagram of a power device according to an embodiment.

FIG. 1 is a construction diagram of a power device according to an embodiment.

Referring to FIG. 1, the power device 1 may include an inverter 10 and a motor 20.

The motor 20 may provide power to an electric vehicle or a fuel cell vehicle. The motor 20 may be driven by being supplied with three-phase alternating current (AC) power.

The inverter 10 may supply the AC power to the motor 20. The inverter 10 may receive direct current (DC) power from a battery or a fuel cell, and may convert the DC power into the AC power. Furthermore, the inverter 10 may output the AC power to the motor 20.

The inverter 10 may include a plurality of power semiconductors 100a to 100f, and may convert the DC power into the AC power through on-off control over the plurality of power semiconductors 100a to 100f. For example, the inverter 10 may supply a positive voltage to the motor 20 by making on the first power semiconductor 100a and off the second power semiconductor 100b in a first time interval of one interval, and may supply a negative voltage to the motor 20 by making off the first power semiconductor 100a and on the second power semiconductor 100b in a second time interval of one interval.

A group of power semiconductors that are disposed in series in a high voltage line and low voltage line on an input side thereof is called an arm. For example, a first power semiconductor 100a and a second power semiconductor 100b may constitute a first arm 12a, a third power semiconductor 100c and a fourth power semiconductor 100d may constitute a second arm 12b, and a fifth power semiconductor 100e and a sixth power semiconductor 100f may constitute a third arm 12c.

In the arm, an upper power semiconductor and a lower power semiconductor may be controlled so that they do not become simultaneously on. For example, in the first arm 12a, the first power semiconductor 100a and the second power semiconductor 100b may alternately become on and off without becoming simultaneously on.

Each of the power semiconductors 100a to 100f may be applied with a high voltage in the state in which each of the power semiconductors 100a to 100f has become off. For example, if the second power semiconductor 100b becomes off in the state in which the first power semiconductor 100a has become on, an input voltage may be applied to the second power semiconductor 100b without change. The input voltage may be a relatively high voltage. Internal pressure of each of the power semiconductors 100a to 100f may be designed to a high level so that each of the power semiconductors 100a to 100f can withstand such a high voltage.

Each of the power semiconductors 100a to 100f may conduct a high current in the state in which each of the power semiconductors 100a to 100f has been on. The motor 20 is driven at a relatively high current. Such a high current may be supplied to the motor 20 through a power semiconductor that has become on.

A high voltage that is applied to each of the power semiconductors 100a to 100f may cause a high switching loss. A high current that passes through the power semiconductors 100a to 100f may cause a high conduction loss. In order to discharge heat generated by such a loss, the power semiconductors 100a to 100f may be packaged as a power semiconductor module including heat dissipation means.

All the power semiconductors 100a to 100f that are included in the inverter 10 may be packaged as one power semiconductor module.

For example, the first power semiconductor 100a, the second power semiconductor 100b, the third power semiconductor 100c, the fourth power semiconductor 100d, the fifth power semiconductor 100e, and the sixth power semiconductor 100f may be packaged as one power semiconductor module. In order to increase the current capacity, an additional power semiconductor that is disposed in parallel to each of the power semiconductors 100a to 100f may be further present. In such a case, the number of power semiconductors that are included in the power semiconductor module may be more than 6. FIG. 1 illustrates only power semiconductors having a transistor form. However, the inverter 10 may further include a power semiconductor having a diode form, in addition to the power semiconductor having a transistor form. For example, a first diode (not illustrated) may be further disposed in parallel to the first power semiconductor 100a. A second diode (not illustrated) may be further disposed in parallel to the second power semiconductor 100b. Furthermore, such diodes may be packaged along with one power semiconductor module.

Power semiconductors that constitute each arm may be packaged as one power semiconductor module.

For example, the first power semiconductor 100a and the second power semiconductor 100b that constitute the first arm 12a may be packaged as one power semiconductor module. The third power semiconductor 100c and the fourth power semiconductor 100d that constitute the second arm 12b may be packaged as another power semiconductor module. The fifth power semiconductor 100e and the sixth power semiconductor 100f that constitute the third arm 12c may be packaged as another power semiconductor module. In order to increase the current capacity, an additional power semiconductor that is disposed in parallel to each of the power semiconductors 100a to 100f may be further present. In such a case, the number of power semiconductors that are included in the power semiconductor module may be more than 2. Furthermore, each arm may further include a power semiconductor having a diode form, in addition to the power semiconductor having a transistor form. Such diodes may also be packaged along with one power semiconductor module.

Each of the power semiconductors 100a to 100f may be packaged as one power semiconductor module.

Figure 2:
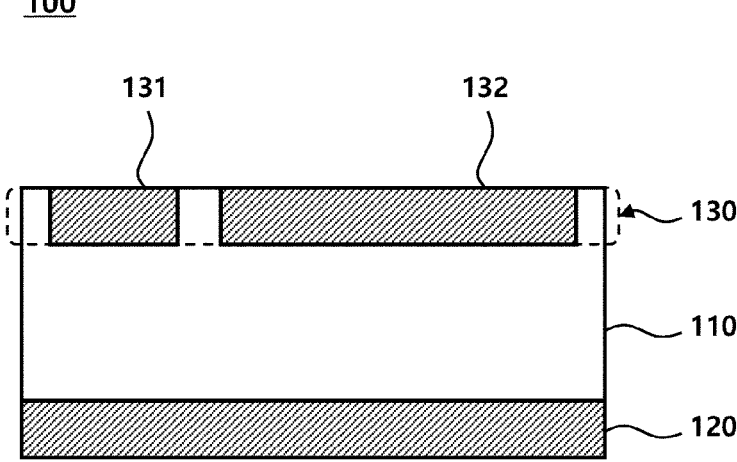
FIG. 2 is a cross-sectional diagram of a power semiconductor die according to an embodiment.

FIG. 2 is a cross-sectional diagram of a power semiconductor die according to an embodiment.

A power semiconductor that is manufactured through a wafer level process may be called a power semiconductor die. The power semiconductor die may be implemented in the form of an insulated gate bipolar transistor (IGBT) or may be implemented in the form of a metal oxide semiconductor field effect transistor (MOSFET).

Referring to FIG. 2, a power semiconductor die 100 may include a first electrode 130 and a second electrode 120.

The first electrode 130 may be disposed on one side of a semiconductor layer 110. For example, the first electrode 130 may be disposed above the semiconductor layer 110 on the basis of FIG. 2. Furthermore, the second electrode 120 may be disposed on the other side of the semiconductor layer 110. For example, the second electrode 120 may be disposed below the semiconductor layer 110 on the basis of FIG. 2.

In the form of the MOSFET, the first electrode 130 may include a gate electrode 131 and a source electrode 132, and the second electrode 120 may include a drain electrode. In the form of the IGBT, the first electrode 130 may include a gate electrode 131 and an emitter electrode 132, and the second electrode 120 may include a collector electrode.

The first electrode 130 may be formed of an Al-based metal. The second electrode 120 may be formed of a Ti/Ni/Ag metal, a NiV/Ag metal or a vanadium (V)/Ni/Ag metal including a Ti layer, a Ni layer, or an Ag layer.

The semiconductor layer 110 may be formed of silicon carbide (SiC).

A metal bump having a given thickness or more may be formed on one side of the power semiconductor die. In an embodiment, this may be called a die structure.

Figure 3:
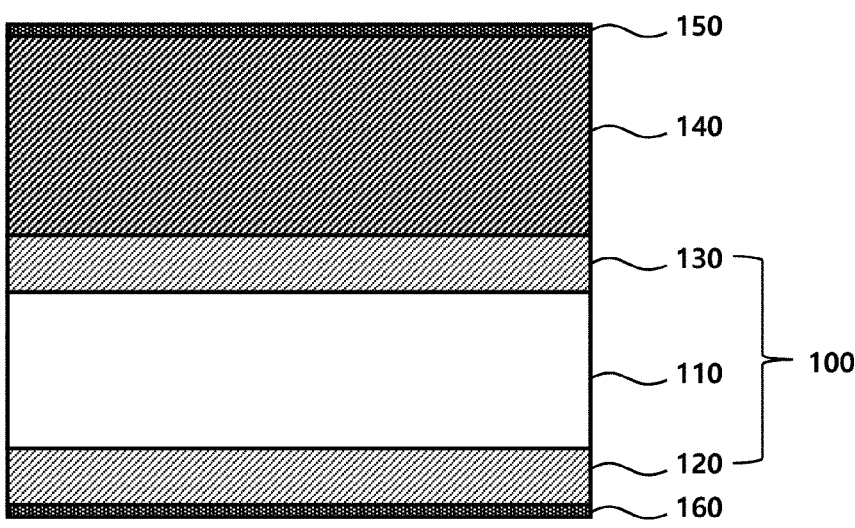
FIG. 3 is a cross-sectional diagram of a die structure according to an embodiment.

FIG. 3 is a cross-sectional diagram of a die structure according to an embodiment.

Referring to FIG. 3, a die structure 300 may include a power semiconductor die 100 and a metal bump 140.

The power semiconductor die 100 may be disposed. The metal bump 140 may be formed on one side of the power semiconductor die 100 through electroless plating. Furthermore, an upper bonding member 150 may be formed on one side of the metal bump 140. A lower bonding member 160 may be formed on the other side of the power semiconductor die 100.

The metal bump 140 may perform a function for maintaining a distance between a first substrate, for example, an upper substrate and a second substrate, for example, a lower substrate by a given distance or more in a power semiconductor module that is described later. In order to perform such a function, the metal bump 140 may have a given thickness or more.

In the design of a power semiconductor module, when a distance between the first substrate and the second substrate is determined, the thickness of the metal bump 140 may be determined by considering thicknesses of the power semiconductor die 100 and another bonding member. Furthermore, in an electroless plating process, the metal bump 140 may be formed in accordance with a predetermined thickness.

The metal bump 140 may be formed of a Cu-based metal. The Cu-based metal has high conductivity. The metal bump 140 may have a function for electrically connecting an electrode of the power semiconductor die 100 and the first substrate, in addition to the function for maintaining the distance between the first substrate and the second substrate.

The upper bonding member 150 and the lower bonding member 160 may be formed of an Sn—Ag-based or Ag-based substance.

The first electrode 130 may be divided into two electrodes that are electrically insulated from each other. The metal bump 140 may also be divided according to such a division.

Figure 4:
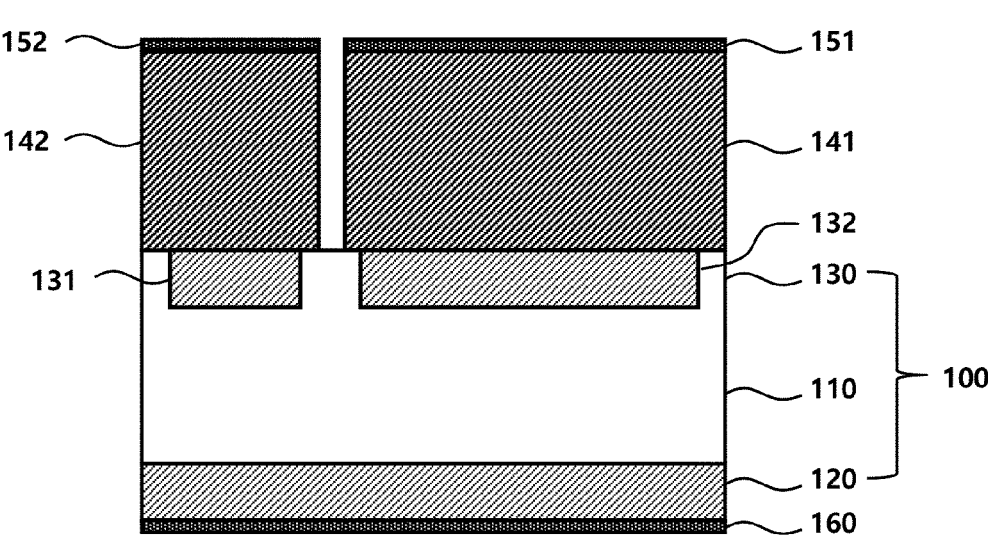
FIG. 4 is a cross-sectional diagram of an example in which a metal bump has been divided in the die structure according to an embodiment.

FIG. 4 is a cross-sectional diagram of an example in which a metal bump has been divided in the die structure according to an embodiment.

Referring to FIG. 4, in a die structure 400, one metal bump 141 may be formed in a way to come into contact with a (2-1)-th electrode 132, and one upper bonding member 151 may be formed on the one metal bump 141. The (2-1)-th electrode 132 may be a source electrode, for example.

Furthermore, another metal bump 142 may be formed in a way to come into contact with a (2-2)-th electrode 131. Another upper bonding member 152 may be formed on the another metal bump 142. The (2-2)-th electrode 131 may be a gate electrode, for example.

The one metal bump 141 and the another metal bump 142 may be electrically insulated from each other. Furthermore, the one upper bonding member 151 and the another upper bonding member 152 may be electrically insulated from each other.

Figure 5:
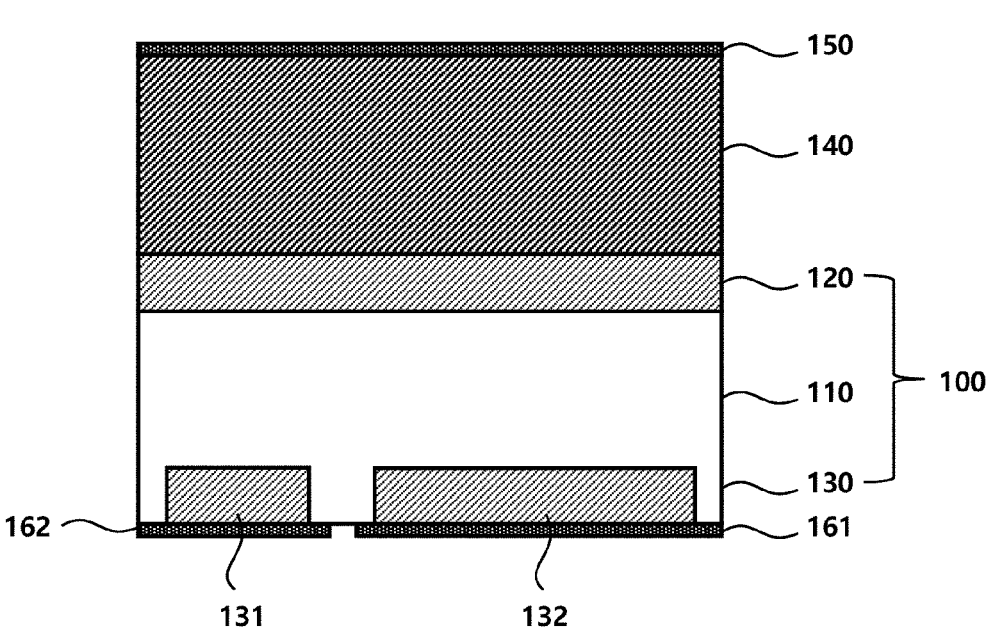
FIG. 5 is a cross-sectional diagram of an example in which a lower bonding member has been divided in the die structure according to an embodiment.

FIG. 5 is a cross-sectional diagram of an example in which a lower bonding member has been divided in the die structure according to an embodiment.

Referring to FIG. 5, in a die structure 500, one lower bonding member 161 may be formed in a way to come into contact with the (2-1)-th electrode 132. The (2-1)-th electrode 132 may be a source electrode, for example.

Furthermore, another lower bonding member 162 may be formed in a way to come into contact with the (2-2)-th electrode 131. The (2-2)-th electrode 131 may be a gate electrode, for example.

Furthermore, the one lower bonding member 161 and the another lower bonding member 162 may be electrically insulated from each other.

A die structure may constitute a power semiconductor module while being bonded to a first substrate and a second substrate.

Figure 6:
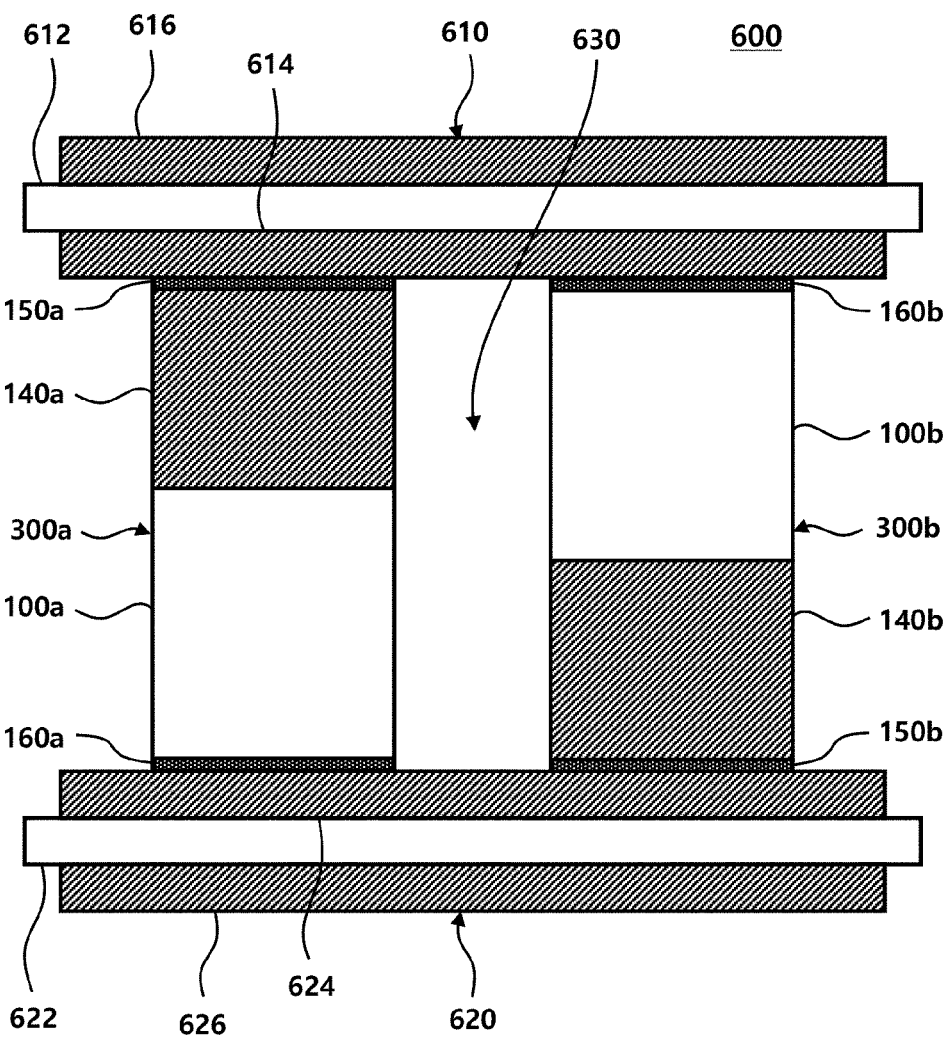
FIG. 6 is a first example construction diagram of a power semiconductor module according to an embodiment.

FIG. 6 is a first example construction diagram of a power semiconductor module according to an embodiment.

Referring to FIG. 6, a power semiconductor module 600 may include a first die structure 300a, a second die structure 300b, a first substrate 610, a second substrate 620, etc.

The first die structure 300a may include a first power semiconductor die 100a and a first metal bump 140a formed on one side of the first power semiconductor die 100a. Furthermore, the first die structure 300a may include a first upper bonding member 150a disposed on the first metal bump 140a and a first lower bonding member 160a disposed on the other side of the first power semiconductor die 100a.

The second die structure 300b may be constructed to have the same form as the first die structure 300a, and may have an arrangement direction only that is opposite to that of the first die structure 300a. For example, the second die structure 300b may include a second power semiconductor die 100b and a second metal bump 140b formed on one side of the second power semiconductor die 100b. Furthermore, the second die structure 300b may include a second upper bonding member 150b disposed on the second metal bump 140b and a second lower bonding member 160b disposed on the other side of the second power semiconductor die 100b.

In the first die structure 300a, a first electrode that is formed on one side of the first power semiconductor die 100a may be electrically connected to the first substrate 610 through the first metal bump 140a. The first metal bump 140a may be bonded to the first substrate 610 through the first upper bonding member 150a, and may be electrically connected thereto.

In the second die structure 300b, a second electrode that is formed on the other side of the second power semiconductor die 100b may be electrically connected to the first substrate 610. The other side of the second power semiconductor die 100b may be bonded to the first substrate 610 through the second lower bonding member 160b, and may be electrically connected thereto.

In the first die structure 300a, a second electrode that is formed on the other side of the first power semiconductor die 100a may be electrically connected to the second substrate 620. The other side of the first power semiconductor die 100a may be bonded to the second substrate 620 through the first lower bonding member 160a, and may be electrically connected thereto.

In the second die structure 300b, a first electrode that is formed on one side of the second power semiconductor die 100b may be electrically connected to the second substrate 620 through the second metal bump 140b. The second metal bump 140b may be bonded to the second substrate 620 through the second upper bonding member 150b, and may be electrically connected thereto.

The first substrate 610 may support one side of the first die structure 300a, and may support the other side of the second die structure 300b.

The first substrate 610 may include a first insulating substance layer 612, a first metal wiring layer 614, and a first heat dissipation metal layer 616.

The first insulating substance layer 612 may electrically insulate the first metal wiring layer 614 and the first heat dissipation metal layer 616. The first insulating substance layer 612 may be formed of a ceramic material having thermal conductivity.

The first heat dissipation metal layer 616 may have one side come into contact with the first insulating substance layer 612, and may dissipate heat to the other side thereof. Heat dissipation means including a cooling medium may be closely disposed on the other side of the first heat dissipation metal layer 616.

Metal wiring may be disposed in the first metal wiring layer 614. The metal wiring may be electrically connected to the first metal bump 140a, and may be electrically connected to an electrode of the second power semiconductor die 100b.

The first metal wiring layer 614 and the first heat dissipation metal layer 616 may be formed of a Cu-based metal. From an aspect in which Cu-based metal has been attached, a substrate such as the first substrate 610 is called a direct bonded copper (DBC) substrate.

The second substrate 620 may support one side of the second die structure 300b, and may support the other side of the first die structure 300a.

The second substrate 620 may include a second insulating substance layer 622, a second metal wiring layer 624, and a second heat dissipation metal layer 626.

The second insulating substance layer 622 may electrically insulate the second metal wiring layer 624 and the second heat dissipation metal layer 626. The second insulating substance layer 622 may be formed of a ceramic material having thermal conductivity.

The second heat dissipation metal layer 626 may have one side come into contact with the second insulating substance layer 622, and may dissipate heat to the other side thereof. Heat dissipation means including a cooling medium may be closely disposed on the other side of the second heat dissipation metal layer 626.

Metal wiring may be disposed in the second metal wiring layer 624. The metal wiring may be electrically connected to the second metal bump 140b, and may be electrically connected to an electrode of the first power semiconductor die 100a.

The second metal wiring layer 624 and the second heat dissipation metal layer 626 may be formed of a Cu-based metal. From an aspect in which a Cu-based metal has been attached, a substrate such as the second substrate 620 is called a heat dissipation substrate, a direct bonded copper (DBC) substrate, or an active metal brazing (AMB) substrate.

An epoxy molding compound (EMC) may be injected into a space 630 between the first die structure 300a and the second die structure 300b. The EMC may perform a function for increasing an insulating distance between the first die structure 300a and the second die structure 300b, protecting the first die structure 300a and the second die structure 300b against oxidizing substances, and fixing the first die structure 300a and the second die structure 300b.

The space 630 may be surrounded by the first die structure 300a and the second die structure 300b, and the first substrate 610 and the second substrate 620. In this case, if the space 630 is narrow, there is a problem in that the EMC is not properly injected or is not properly distributed and bubbles are formed in some locations of the space. In order to improve such a problem, the first substrate 610 and the second substrate 620 need to be spaced apart from each other at a certain distance or more. A function for maintaining the distance may be performed by the first metal bump 140a and the second metal bump 140b.

The thickness of the metal bump 140a, 140b may be determined by the thickness of a power semiconductor die and the thickness of the final package. For example, the thickness of the metal bump 140a, 140b may be predetermined in a range that is 0.5 to 2 times of the thickness of the power semiconductor die. For example, if the thickness of the power semiconductor die is 200 um, the thickness of the metal bump 140a, 140b may have a value between 150 um and 300 um.

A difference between the thickness of the first metal bump 140a and the thickness of the second metal bump 140b may be within a predetermined tolerance range. The first metal bump 140a and the second metal bump 140b may be formed through an electroless plating process. It has been known that the electroless plating process has relatively accurate thickness control.

A power semiconductor module according to an embodiment can minimize a flatness problem, an adhesion failure problem, or a miss-alignment problem between the first substrate 610 and the second substrate 620, which occurs due to a difference between the thickness of the first metal bump 140a and the thickness of the second metal bump 140b, because the die structures 300a and 300b are formed by using a relatively accurate process as described above.

In the first example, the second die structure 300b has been described as having an arrangement direction opposite to that of the first die structure 300a, but the second die structure 300b may be disposed in the same direction as the first die structure 300a in some embodiments.

More die structures may be additionally disposed in the power semiconductor module.

Figure 7:
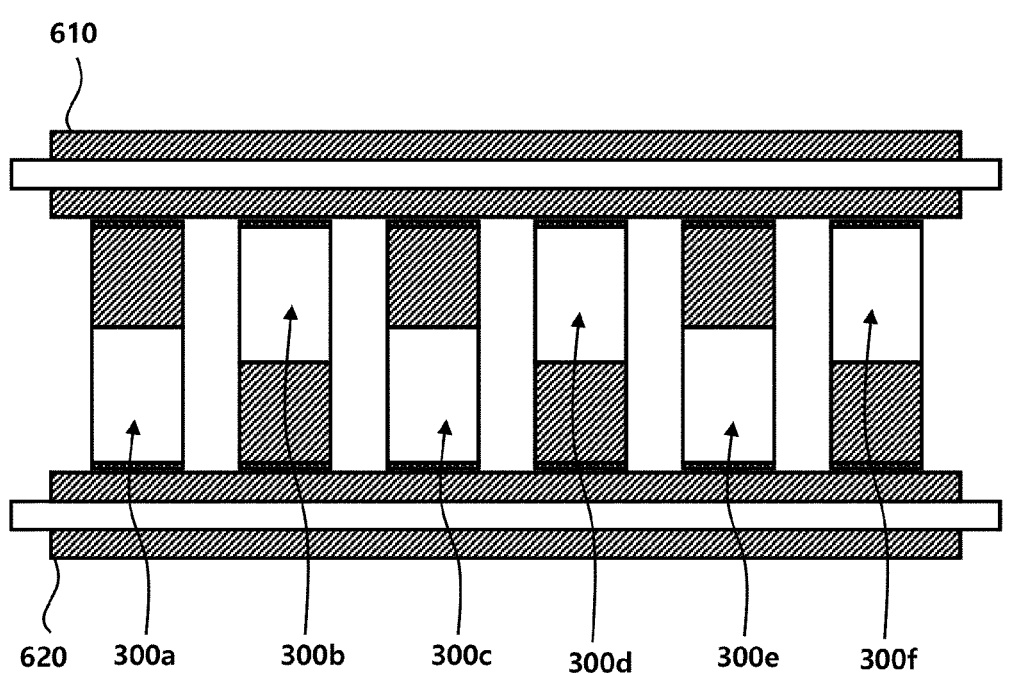
FIG. 7 is a second example construction diagram of a power semiconductor module according to an embodiment.

FIG. 7 is a second example construction diagram of a power semiconductor module according to an embodiment.

Referring to FIG. 7, a power semiconductor module 700 may further include a third die structure 300c and a fifth die structure 300e each of which has the same structure as a first die structure 300a and has a first electrode electrically connected to a first substrate 610 and a second electrode electrically connected to a second substrate 620, in addition to the first die structure 300a.

Furthermore, the power semiconductor module 700 may further include a fourth die structure 300d and a sixth die structure 300f each of which has the same structure as a second die structure 300b and has a second electrode electrically connected to the first substrate 610 and a first electrode electrically connected to the second substrate 620, in addition to the second die structure 300b.

According to an embodiment, although multiple power semiconductors are disposed within the power semiconductor module 700 as described above, a flatness problem, an adhesion failure problem, or a miss-alignment problem can be minimized because the thickness of the die structure can be precisely controlled.

Figure 8:
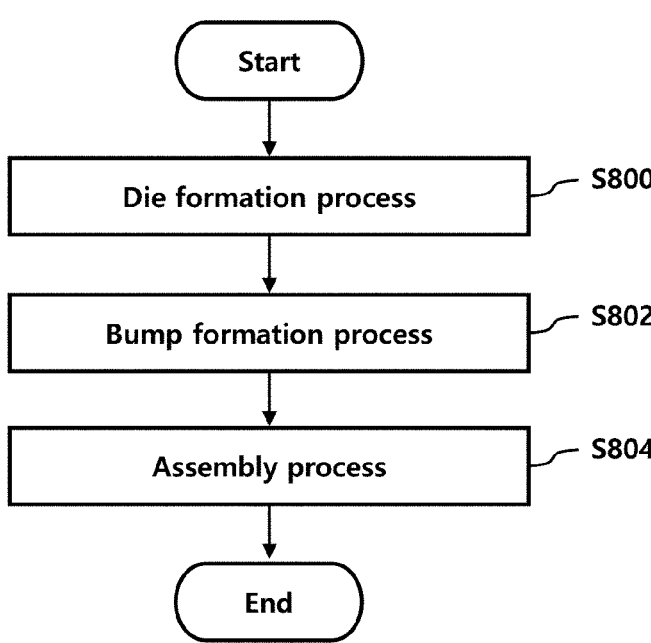
FIG. 8 is a flowchart of a method of manufacturing a power semiconductor module according to an embodiment.

FIG. 8 is a flowchart of a method of manufacturing a power semiconductor module according to an embodiment.

Referring to FIG. 8, a plurality of power semiconductor dies may be formed through a wafer level process (S800).

In the wafer level process, the semiconductor layer of each power semiconductor die may be doped. A first electrode may be formed on one side of the semiconductor layer, and a second electrode may be formed on the other side thereof.

After the plurality of power semiconductor dies is fabricated, a first metal bump may be formed on one side of a first power semiconductor die through a bump process, and a second metal bump may be formed on one side of a second power semiconductor die (S802).

The metal bump may be formed through electroless plating. The first metal bump may be formed on one side of the first power semiconductor die and the second metal bump may be formed on one side of the second power semiconductor die through electroless plating.

In this case, the metal bump may be formed of a Cu-based metal.

After the first metal bump and the second metal bump are formed, an upper bonding member may be formed one side of the first metal bump and one side of the second metal bump. The upper bonding member may be formed of an Sn—Ag-based substance, and may be formed through electroless plating.

A lower bonding member may be formed on the other side of the first power semiconductor die and the other side of the second power semiconductor die. The lower bonding member may be formed of an Sn—Ag-based or an Ag-based substance, and may be formed through electroless plating.

Through such a process, a first die structure and a second die structure may be formed.

After the first die structure and the second die structure are formed, a process of bonding the first die structure and the second die structure to a first substrate and a second substrate may be performed (S804).

In the bonding process, one side of the first metal bump and the other side of the second power semiconductor die may be bonded to the first substrate. One side of the second metal bump and the other side of the first power semiconductor die may be bonded to the second substrate.

The first die structure and the second die structure may be bonded to the first substrate through soldering. For example, one side of the first metal bump and the other side of the second power semiconductor die may be soldered to the first substrate by applying heat to the upper bonding member disposed on the first metal bump and the lower bonding member disposed on the other side of the second power semiconductor die.

The first die structure and the second die structure may be bonded to the first substrate through sintering. An Ag-based bonding member that is formed of particles having a micro size or a nano size may be disposed in the first substrate. Furthermore, in the bonding process, as heat and pressure or heat is applied to the Ag-based bonding member, one side of the first metal bump and the other side of the second power semiconductor die may be sintered to the first substrate.

The first die structure and the second die structure may be bonded to the second substrate through soldering. For example, one side of the second metal bump and the other side of the first power semiconductor die may be soldered to the second substrate by applying heat to the upper bonding member disposed on the second metal bump and the lower bonding member disposed on the other side of the first power semiconductor die.

The first die structure and the second die structure may be bonded to the second substrate through sintering. An Ag-based bonding member constituted with particles having a micro size or a nano size may be disposed in the second substrate. Furthermore, in the bonding process, as heat and pressure or heat is applied to the Ag-based bonding member, one side of the second metal bump and the other side of the first power semiconductor die may be sintered to the second substrate.

Figure 9:
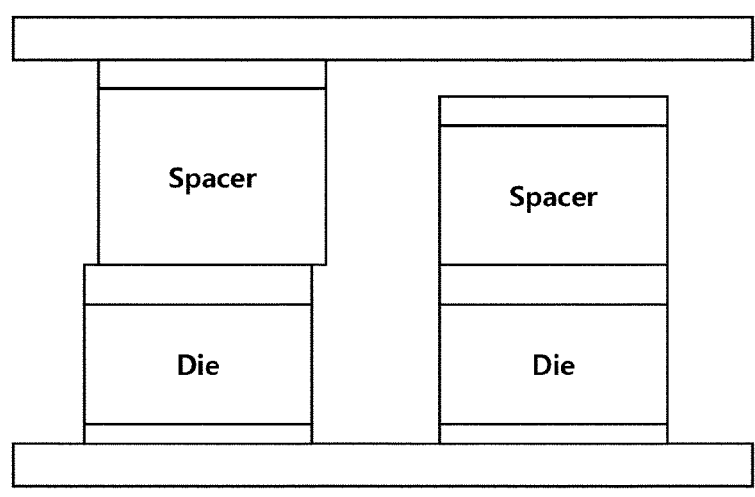
FIG. 9 is a diagram illustrating a structure in which a distance between substrates is maintained by using a spacer.

FIG. 9 is a diagram illustrating a structure in which a distance between substrates is maintained by using a spacer.

Referring to FIG. 9, a power semiconductor module can maintain a distance between an upper substrate and a lower substrate by using a spacer.

The spacer is produced through a process different from that of a power semiconductor die. Furthermore, the spacer is bonded to the power semiconductor die through a bonding process. In such a bonding process, a miss-alignment problem may occur between the spacer and the power semiconductor die.

The spacer is an individual component that is produced through a process different from that of the power semiconductor die. Accordingly, when multiple spacers are used, a deviation between the spacers may occur. Even in the power semiconductor die, considering that a deviation occurs, a deviation between the spacers causes a generally great deviation. As illustrated in FIG. 9, the deviation between the spacers may generate a problem with the flatness of a power semiconductor module. The flatness problem may be derived as an electrical connection failure problem.

A power semiconductor module according to an embodiment can improve the miss-alignment problem, the deviation problem, the flatness problem, or the electrical connection failure problem by removing the spacer and using the metal bump that is integrated with the power semiconductor die.

As described above, according to the present embodiment, a spacer, that is, a component in the double-sided heat dissipation power semiconductor module, does not need to be prepared. A bonding process between a power semiconductor die and a spacer can be omitted. A miss-alignment problem can be solved through the spacer-integrated die structure that has been implemented through a semiconductor process. Furthermore, an adhesion failure and a flatness problem occurring due to the existing height deviation between components can be improved through accurate height control of a metal bump process. A reduction in the yield which occurs in a molding process can be significantly improved. Furthermore, a low reliability problem according to forms and materials of internal components can be improved.

What is claimed is:

1. A power semiconductor module comprising:
a die structure in which a metal bump is formed on one side of a power semiconductor die;
a first substrate to be electrically connected to a first electrode formed on the one side of the power semiconductor die through the metal bump; and
a second substrate to be electrically connected to a second electrode formed on another side of the power semiconductor die and to support the other side of the power semiconductor die, wherein the metal bump is directly in contact with the one side of the power semiconductor die without a bonding layer, wherein a lateral width of the metal bump is the same as that of the die structure, wherein the metal bump is disposed on only the one side of the power semiconductor die, wherein the die structure is bonded to the first substrate through a first bonding member disposed on one side of the metal bump and bonded to the second substrate through a second bonding member disposed on the other side of the power semiconductor die without a spacer disposed between the die structure and the first substrate or between the die structure and the second substrate, and wherein the metal bump is formed through electroless plating on the one side of the power semiconductor die.

2. The power semiconductor module of claim 1, wherein the metal bump has a thickness predetermined in a range between 0.5 times and 2 times a thickness of the power semiconductor die.

3. The power semiconductor module of claim 1, wherein the metal bump is formed of a Cu-based metal.

4. The power semiconductor module of claim 1, wherein an epoxy molding compound (EMC) is disposed in a space between the die structure, the first substrate, and the second substrate.

5. The power semiconductor module of claim 1, wherein the first substrate comprises an insulating substance layer, a heat dissipation metal layer disposed on one side of the insulating substance layer, and a metal wiring layer disposed on the other side of the insulating substance layer.

6. The power semiconductor module of claim 1, wherein the metal bump is directly in contact with the one side of the power semiconductor die without the bonding layer including a solder layer.

7. The power semiconductor module of claim 1, wherein the die structure comprises a first power semiconductor die and a second power semiconductor die spaced apart from each other, and wherein the metal bump comprises a first metal bump disposed only on a top surface of the first power semiconductor die, and a second metal bump disposed only on a bottom surface of the second power semiconductor die.

8. The power semiconductor module of claim 1, wherein a lateral width of the first bonding member is the same as that of the metal bump, wherein a lateral width of the second bonding member is the same as that of the die structure, and wherein a thickness of the metal bump is greater than that of the first bonding member.

* * * * *